United States Patent
Jeong et al.

(10) Patent No.: US 10,106,914 B2
(45) Date of Patent: Oct. 23, 2018

(54) APPARATUS FOR MANUFACTURING SEMICONDUCTOR DEVICE AND METHOD FOR MANUFACTURING SEMICONDUCTOR DEVICE USING SAME

(71) Applicant: AP SYSTEMS INC., Hwaseong-Si, Gyeonggi-Do (KR)

(72) Inventors: Pil Seong Jeong, Yongin-Si (KR); Sang Hyun Ji, Yongin-Si (KR); Sung Yong Lee, Yongin-Si (KR); Yong Woo Han, Osan-Si (KR)

(73) Assignee: AP SYSTEMS INC. (KR)

(*) Notice: Subject to any disclaimer, the term of this patent is extended or adjusted under 35 U.S.C. 154(b) by 56 days.

(21) Appl. No.: 15/081,836

(22) Filed: Mar. 25, 2016

(65) Prior Publication Data
US 2016/0284562 A1    Sep. 29, 2016

(30) Foreign Application Priority Data
Mar. 27, 2015   (KR) .................. 10-2015-0042994

(51) Int. Cl.
*C30B 29/06*   (2006.01)
*H01L 21/67*   (2006.01)
(Continued)

(52) U.S. Cl.
CPC .............. *C30B 29/06* (2013.01); *C23C 16/24* (2013.01); *C23C 16/56* (2013.01); *C30B 28/08* (2013.01);
(Continued)

(58) Field of Classification Search
CPC .... H01L 21/0231; H01L 21/02345–21/02354;
(Continued)

(56) References Cited

U.S. PATENT DOCUMENTS 5,834,797 A * 11/1998 Yamanaka ............ G02F 1/1362
257/347
2003/0148565 A1 * 8/2003 Yamanaka .......... H01L 21/2026
438/200
(Continued)

FOREIGN PATENT DOCUMENTS

JP   2009159238   7/2009
KR   20080067002 A   7/2008
(Continued)

*Primary Examiner* — Julio J Maldonado
*Assistant Examiner* — Stanetta Isaac
(74) *Attorney, Agent, or Firm* — Renaissance IP Law Group LLP (57) ABSTRACT

The present disclosure controls the heat source unit such that a to-be-processed object in which a hydrogen-containing to-be-processed layer is formed is irradiated with light in two stages, and thus the electrical characteristics of a semiconductor device may be suppressed and prevented from being deteriorated due to hydrogen. That is, ultraviolet light (UV) which is firstly radiated may induce a chemical reaction for separating Si—H bonds in the to-be-processed layer, and infrared light (IR) which is secondly radiated may induce a thermal reaction for vaporizing the separated hydrogen from the Si—H bonds. As such, both a chemical reaction for separating bonds of hydrogen and other ions in the to-be-processed layer and a thermal reaction for vaporizing hydrogen are performed, and thus hydrogen may be more easily removed than a temperature at which hydrogen is vaporized from the to-be-processed layer by only a thermal reaction.

11 Claims, 10 Drawing Sheets

(51) Int. Cl.
  *H01L 29/66* (2006.01)
  *C23C 16/56* (2006.01)
  *C23C 16/24* (2006.01)
  *C30B 28/08* (2006.01)

(52) U.S. Cl.
  CPC .... *H01L 21/67115* (2013.01); *H01L 29/6675* (2013.01)

(58) Field of Classification Search
  CPC ............... H01L 21/02675–21/02686; H01L 21/3003–21/3006; H01L 21/02304; H01L 21/02356–21/02362; H01L 21/10–21/108; H01L 21/14–21/145; H01L 21/161–21/168; H01L 21/205–21/2053; H01L 21/28176
  See application file for complete search history.

(56) References Cited

U.S. PATENT DOCUMENTS

2009/0258465 A1* 10/2009 Chung .............. H01L 21/02532
                                                      438/166
2016/0284572 A1*  9/2016 Jeong .................. H05B 1/0233

FOREIGN PATENT DOCUMENTS

KR    20090101831 A    9/2009
KR    20090107747 A    10/2009

\* cited by examiner

APPARATUS FOR MANUFACTURING SEMICONDUCTOR DEVICE AND METHOD FOR MANUFACTURING SEMICONDUCTOR DEVICE USING SAME

CROSS-REFERENCE TO RELATED APPLICATION

This application claims priority to Korean Patent Application No. 10-2015-0042994 filed on Mar. 27, 2015 and all the benefits accruing therefrom under 35 U.S.C. § 119, the contents of which are incorporated by reference in their entirety.

BACKGROUND

The present disclosure relates to an apparatus for manufacturing semiconductor device and a method for manufacturing semiconductor device using the same which are capable of easily controlling the hydrogen concentration in a thin film.

In general, a thin film transistor (TFT) includes a semiconductor thin film formed on a substrate having an insulating surface, is widely used for electronic devices such as integrated circuits (ICs) or electro-optic devices, and is especially used as a switching device for image display apparatuses.

While the thin film transistor uses a metal oxide exhibiting a semiconductor characteristic as a channel forming region, and is formed so as to have a semiconductor layer, hydrogen ions are necessarily present in the thin film due to materials and processes for manufacturing the thin film transistor.

These hydrogen ions fill vacant regions inside the semiconductor layer, and thus there may be an advantage of ensuring the operation stability of the semiconductor device. However, when the hydrogen concentration is higher than such a degree that fills the vacant regions inside the semiconductor layer, there is caused a limitation of deteriorating the interface charge characteristics of the semiconductor layer. Accordingly, when manufacturing the thin film transistor, the dehydrogenation for controlling the hydrogen concentration in the thin film has emerged as an important problem.

Thus, in related arts, a furnace apparatus is used to heat the thin film, thereby controlling and removing the hydrogen. However, while the most important process control parameter for controlling the hydrogen concentration is an amount of heat treatment, furnaces are difficult to control all parts of heat input (rising, maintaining, cooling) because it is possible to manage only a heat maintaining part. Thus, it is not easy to control the hydrogen concentration by using the furnace apparatus.

Also, there is a limitation of requiring a long heat treatment time due to the characteristics of the furnace apparatus, and thereby a limitation of increasing a manufacturing lead time subsequently occurs.

Also, while the furnace apparatus performs the dehydrogenation at a temperature of approximately 450° C. or higher, a flexible substrate (e.g., plastic) used for a flexible display may be deformed due to a high temperature, thereby causing a limitation in that the dehydrogenation process cannot be formed.

RELATED ART DOCUMENT

Patent Documents (Patent document 1) JP2009-159238A
(Patent document 2) KR2009-0101831A

SUMMARY

The present disclosure provides an apparatus for manufacturing semiconductor device and a method for manufacturing semiconductor device using the same which are capable of easily controlling the hydrogen concentration in a to-be-processed object.

The present disclosure also provides an apparatus for manufacturing semiconductor device and a method for manufacturing semiconductor device using the same which are capable of suppressing and preventing the occurrence of deformation of a to-be-processed object due to a high temperature.

The present disclosure also provides an apparatus for manufacturing semiconductor device and a method for manufacturing semiconductor device using the same which are capable of reducing the time required to removing hydrogen in a to-be-processed object and the temperature at which the dehydrogenation is performed.

The present disclosure also provides an apparatus for manufacturing semiconductor device and a method for manufacturing semiconductor device using the same which are capable of improving the electrical characteristics of a semiconductor device.

In accordance with an exemplary embodiment, an apparatus for manufacturing a semiconductor device includes: a chamber for providing a space in which an object to be processed is processed; a stage which is disposed inside the chamber and on which the to-be-processed object is mounted; a heat source unit configured to irradiate the to-be-processed object with light in two stages; and a control unit which is connected to the heat source unit to control the heat source unit such that light is radiated in the two stages.

The heat source unit may include: a first lamp configured to irradiate the to-be-processed object with ultraviolet light; and a second lamp configured to irradiate the to-be-processed object with infrared light.

The first lamp may be disposed so as to surround the second lamp.

With respect to an entire area of an irradiated surface of the to-be-processed object, a radiation area of the first lamp may be greater than that of the second lamp.

The control unit may control the heat source unit such that the second lamp is operated after the first lamp is operated.

The control unit may operate the second lamp at the same time when the operation of the first lamp is stopped.

The control unit may operate the second lamp with a time difference after the operation of the first lamp is stopped.

The control unit may control an operation time of the first lamp and an operation time of the second lamp to overlap each other.

The to-be-processed object may include a substrate and a to-be-processed layer formed to contain hydrogen on the substrate, and the to-be-processed layer may be formed on the substrate through a chemical vapor deposition (CVD) method by using a source including hydrogen (H).

In accordance with another exemplary embodiment, a method for manufacturing a semiconductor device having source and drain electrodes, the method comprising: forming a to-be-processed layer containing hydrogen on a substrate; and performing dehydrogenation by irradiating the to-be-processed layer with light in two stages.

The performing of dehydrogenation may be performed after forming a gate electrode on the substrate and forming a gate insulating film on the gate electrode by using the to-be-processed layer.

The performing of dehydrogenation may be performed after forming source and drain electrodes on the substrate and forming an active pattern on the source and drain electrodes, and forming a gate insulating film on the active pattern by the to-be-processed layer.

The performing of dehydrogenation may be performed after amorphous silicon is formed on the substrate by the to-be-processed layer.

The performing of dehydrogenation may be performed at a temperature of approximately 350° C. to approximately 400° C.

The performing of dehydrogenation may include: firstly radiating light to debond a chemical bond of Si—H in the to-be-processed layer; and secondly radiating light to vaporize the separated hydrogen after the firstly radiating of light.

The first light which debonds a chemical bond of Si—H in the to-be-processed layer may be ultraviolet light, and the second light which vaporizes the separated hydrogen (H) may be light of an infrared range.

The firstly radiating of light and the secondly radiating of light may be performed in the same space as each other.

The firstly radiating of light and the secondly radiating of light may be performed in spaces different from each other.

The to-be-processed layer may be a thin film formed through a chemical vapor deposition method by using a hydrogen (H)-containing source on the substrate.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Preferred embodiments of the present invention will be described below in more detail with reference to the accompanying drawings. The present disclosure may, however, be in different forms and should not be construed as limited to the embodiments set forth herein. Rather, these embodiments are provided so that this disclosure will be thorough and complete and will fully convey the scope of the present disclosure to those skilled in the art. In the drawings, like reference numerals refer to like elements throughout.

Figure 1:
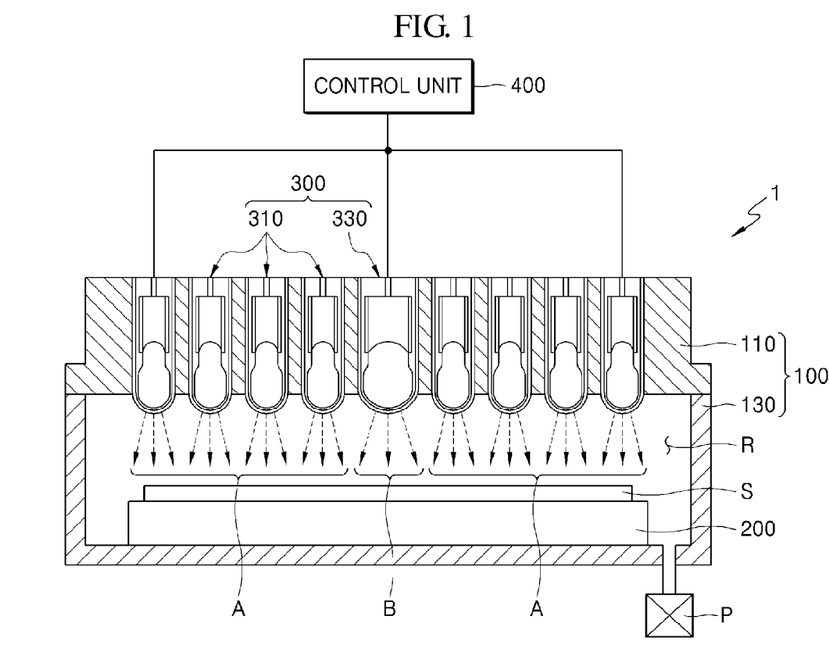
FIG. 1 is a cross-sectional view illustrating an apparatus for manufacturing a semiconductor device in accordance with an exemplary embodiment.
Figure 6:
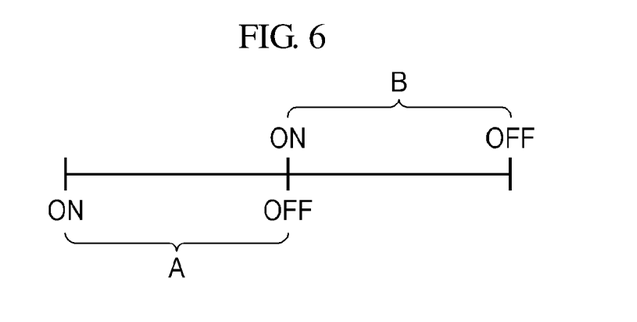
FIG. 6~8 are a view illustrating a method of a control unit for controlling a heat source unit in accordance with an exemplary embodiment.
Figure 7:
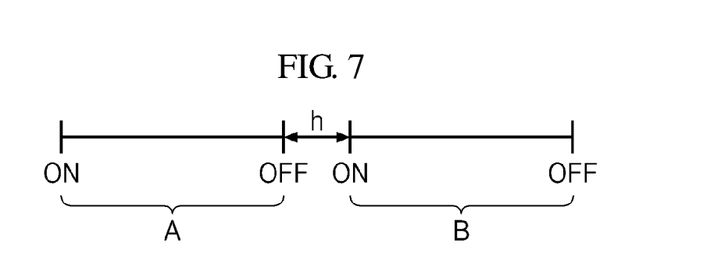
Figure 8:
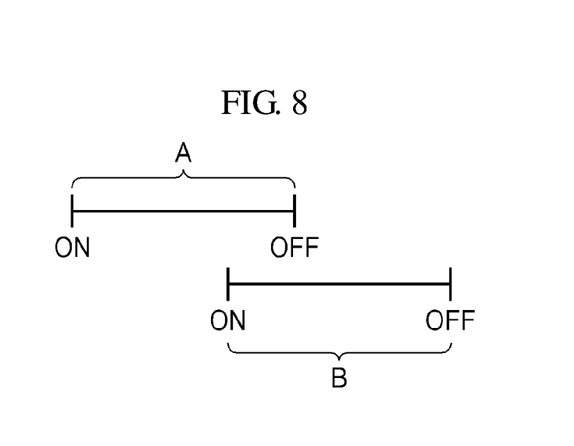
Figure 9:
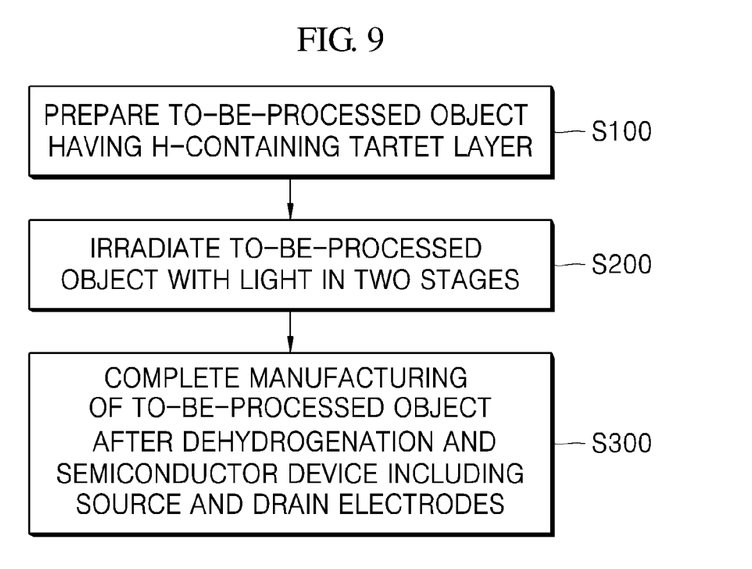
FIG. 9 is a flowchart sequentially illustrating a method for manufacturing a semiconductor device in accordance with an exemplary embodiment.
Figure 10:
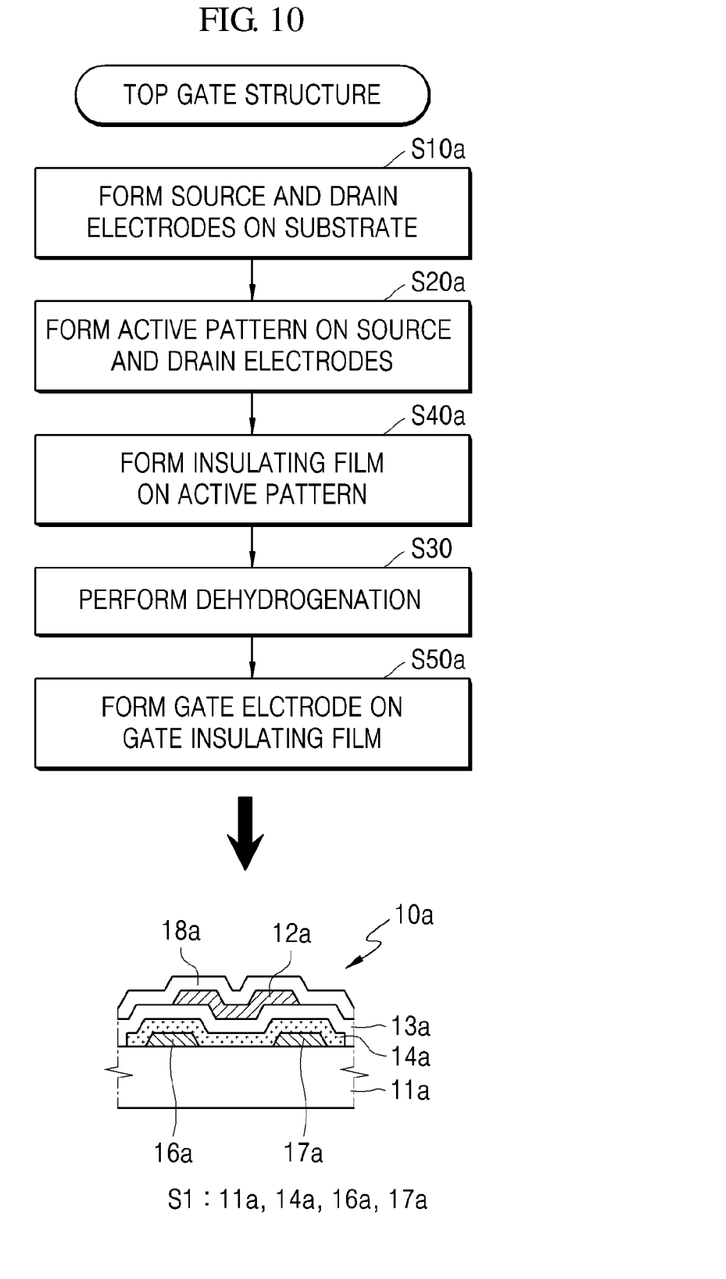
FIG. 10~12 are a flowchart sequentially illustrating a method for manufacturing a semiconductor device in accordance with kinds of to-be-processed objects in an exemplary embodiment.
Figure 11:
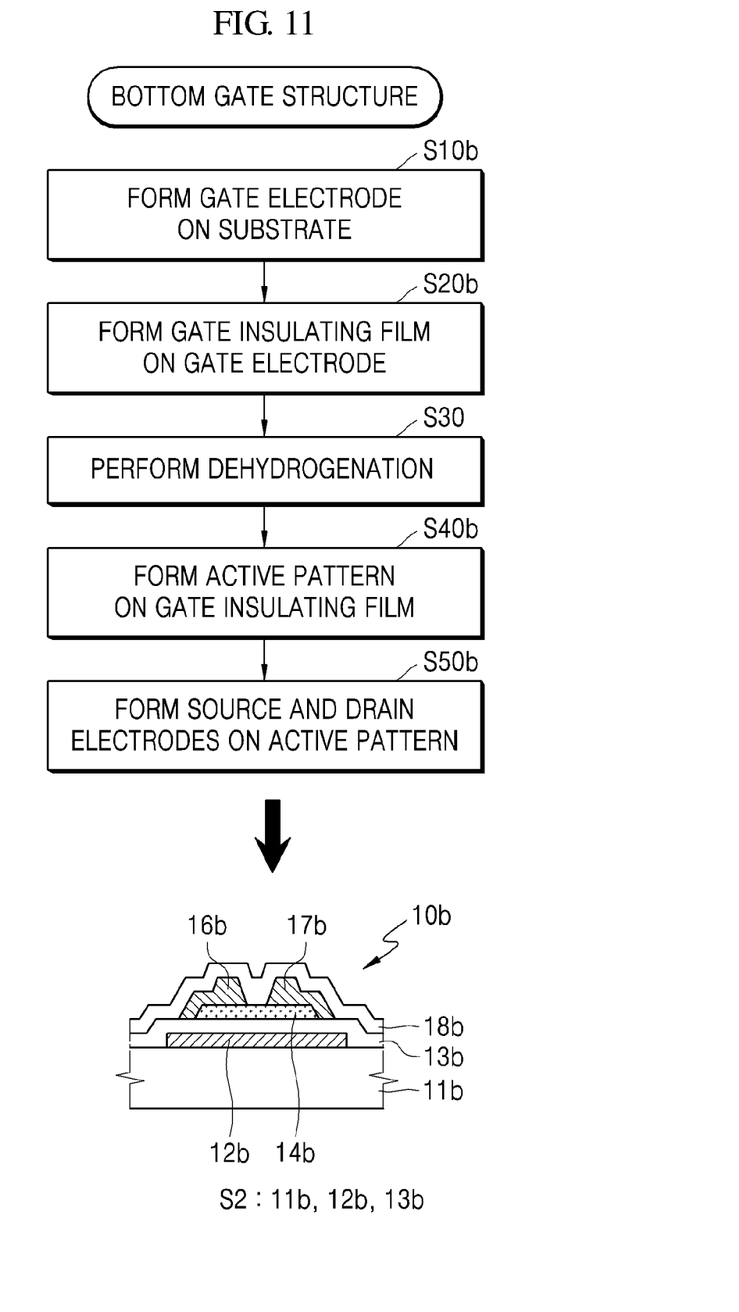
Figure 12:
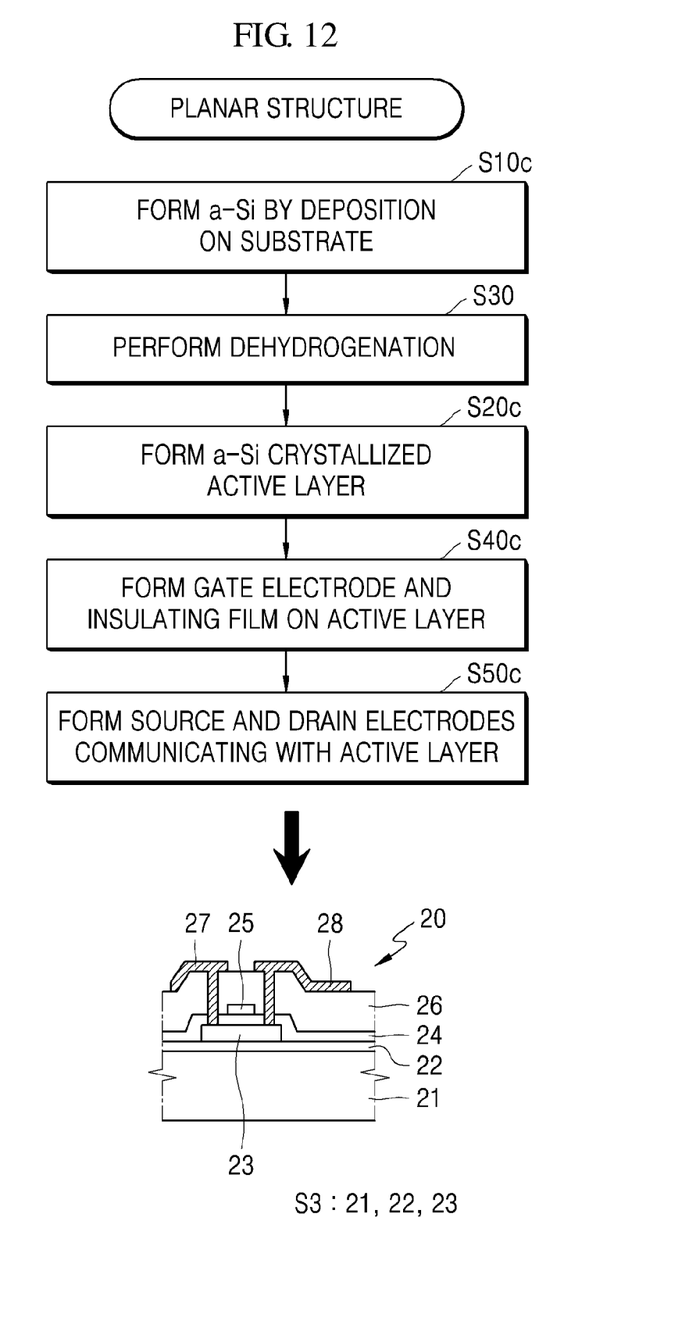
Figure 13:
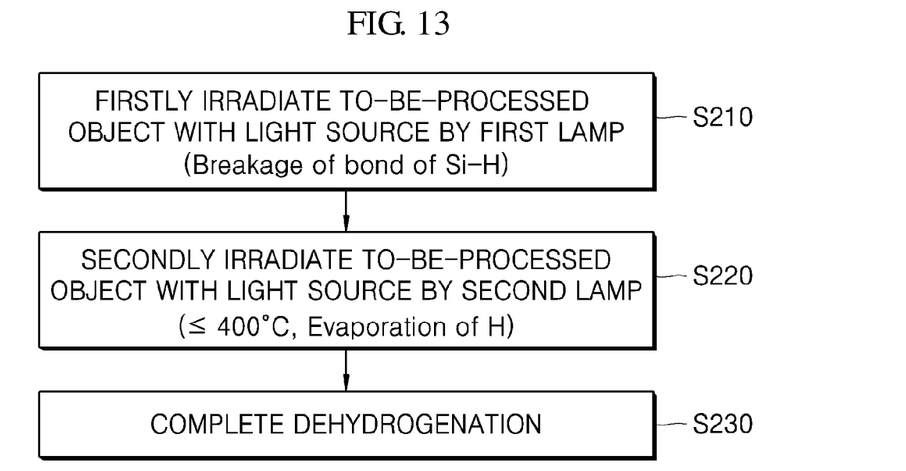
FIG. 13 is a flowchart illustrating a dehydrogenation process in accordance with an exemplary embodiment.
Figure 14:
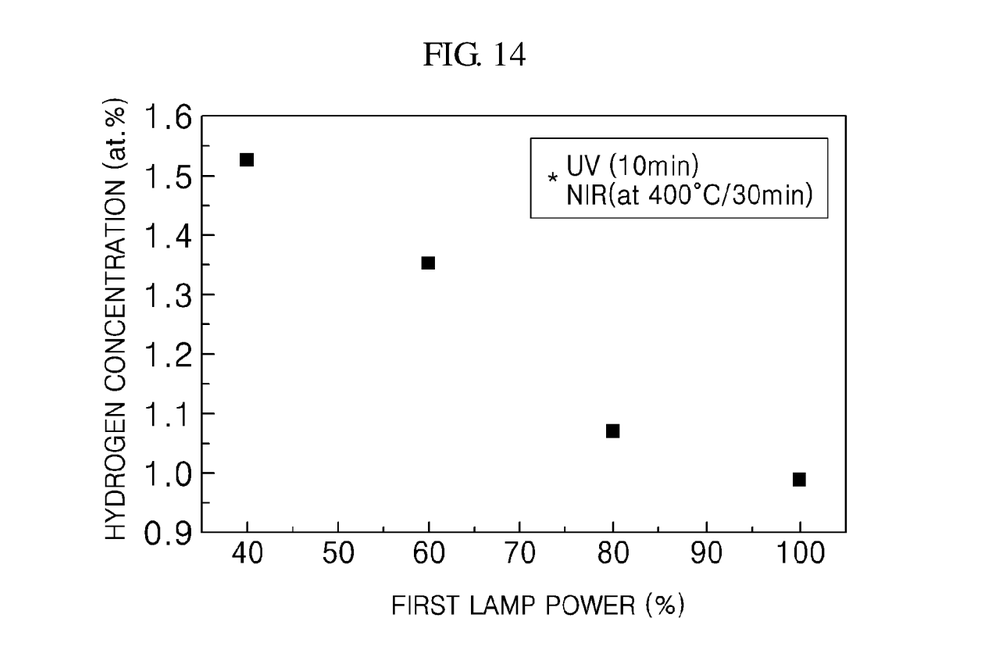
FIG. 14 is a graph illustrating a change in a hydrogen concentration in a to-be-processed object in accordance with a power (%) of a first lamp in the dehydrogenation process in accordance with an exemplary embodiment.
Figure 15:
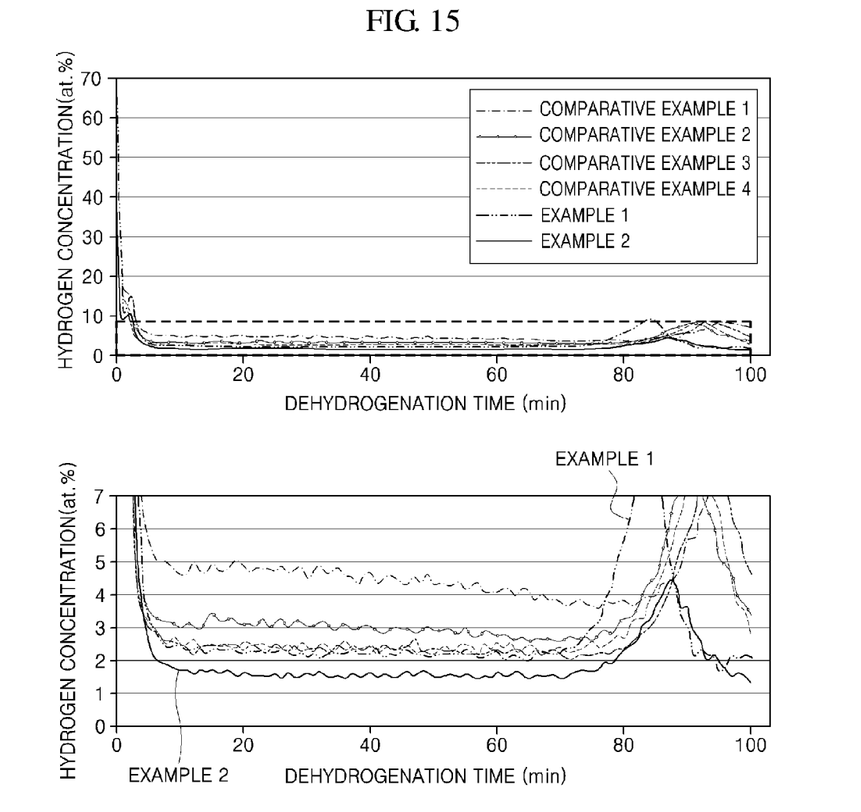
FIG. 15 is a graph illustrating changes in a hydrogen concentration in a to-be-processed object in accordance with a dehydrogenation process in accordance with an exemplary embodiment and a related art.
Figure 16:
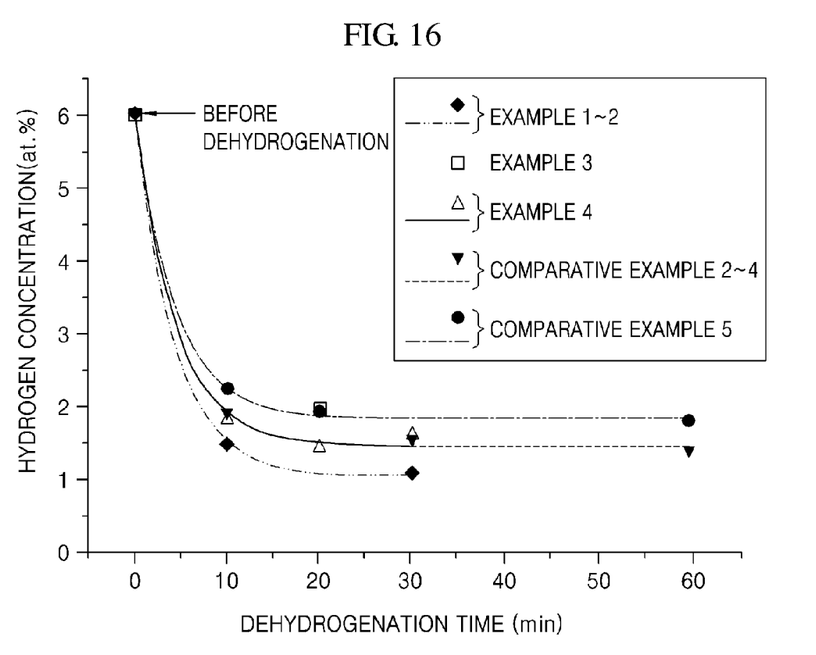
FIG. 16 is a graph illustrating a change in a process temperature in accordance with a dehydrogenation process in an exemplary embodiment.

Hereinafter, an apparatus for manufacturing semiconductor device and a method for manufacturing semiconductor device using the same will be described with reference to FIGS. 1 to 16. Here, FIG. 1 is a cross-sectional view illustrating an apparatus for manufacturing a semiconductor device in accordance with an exemplary embodiment. FIGS. 2 to 5 are a view for describing a heat source unit in accordance with an exemplary embodiment. FIGS. 6 to 8 are views illustrating a method of a control unit for controlling a heat source control unit in accordance with an exemplary embodiment. FIG. 9 is a flowchart sequentially illustrating a method for manufacturing a semiconductor device in accordance with an exemplary embodiment. FIGS. 10 to 12 are flowcharts sequentially illustrating a method for manufacturing a semiconductor device in accordance with kinds of to-be-processed objects in an exemplary embodiment. FIG. 13 is a flowchart illustrating a dehydrogenation process in accordance with an exemplary embodiment. FIGS. 14 to 16 are results of comparing hydrogen concentrations in semiconductor devices, which are manufactured by an apparatus for manufacturing semiconductor device and a method for manufacturing semiconductor device using the same, with those in related arts. Here, FIG. 14 is a graph illustrating a change in a hydrogen concentration in the to-be-processed object in accordance with a power (%) of a first lamp in the dehydrogenation process in accordance with an exemplary embodiment. FIG. 15 is a graph illustrating changes in a hydrogen concentration in the to-be-processed object in accordance with a dehydrogenation process of an exemplary embodiment and a related art. FIG. 16 is a graph illustrating a change in a process temperature in accordance with a dehydrogenation process in an exemplary embodiment.

An apparatus 1 for manufacturing semiconductor device according to an exemplary embodiment, is capable of controlling a hydrogen (H) concentration by easily removing hydrogen (H) from a to-be-processed layer in a to-be-processed object S on which the hydrogen (H)-containing to-be-processed layer is formed, the apparatus including: a chamber 100 providing a space R in which the to-be-processed object S is processed; a stage 200 which is disposed inside the chamber 100 and on which the to-be-processed object S is mounted; a heat source unit 300 configured to irradiate the to-be-processed object S with light in two stages, the heat source unit being disposed over the stage 200 so as to be spaced apart from the stage 200; and a control unit 400 which is connected to the heat source unit 300 to control the heat source unit 300 so as to radiate light in two stages.

That is, the apparatus 1 for manufacturing semiconductor device according to an exemplary embodiment is a dehydrogenation apparatus for removing hydrogen ions in a thin film of the to-be-processed object S by sequentially irradiating the to-be-processed object S with a first light source A and a second light source B which are different from each other. Here, the to-be-processed object S refers to an intermediate structure which is in a state of containing Si—H bonding structure during the process of manufacturing a semiconductor device which has source and drain electrodes. That is, the to-be-processed object S includes a to-be-processed layer which is formed on a substrate so as to contain hydrogen, and the to-be-processed layer may be layers different from each other according to kinds and structures which are used as an active layer in the semiconductor device to be manufactured. However, the layers are the same in that a Si—H bond is formed thereon in a process before the forming of the source and drain electrodes during a process of manufacturing a semiconductor device having the source and drain electrodes.

The chamber 100, which provides a space in which the dehydrogenation process of the to-be-processed object S is performed, accommodates the to-be-processed object S therein and thereby provides a space in which a two-stage irradiation of the to-be-processed object S with light is performed. Here, the chamber 100 may be divided into a lower chamber 130 which provides a space for treating the to-be-processed object S, and an upper chamber 110 which is coupled to an upper portion of the lower chamber 130 and is provided with the heat source unit 300 configured to irradiate the to-be-processed object S with light in two-stages. Accordingly, the lower and upper chambers 130 and 110 are separated from each other such that the upper portion of the lower chamber 130 is opened and the lower portion of the upper chamber 110 is opened, so that the space in which the to-be-processed object S is processed may be opened or closed from the outside. Also, the upper and lower chambers 110 and 130 are separated such that when the treating space R is opened, the to-be-processed object S may be loaded into the treating space R. However, the structure of the chamber 100 and methods for loading the to-be-processed object S into the treating space R are not limited thereto.

Here, a pump P for making the treating space R a vacuum state or an atmospheric state may be connected to the chamber 100. That is, when the treating space R is maintained at a vacuum state by suctioning gas in the treatment space R, impurities may be prevented from adhering to the to-be-processed object S.

The stage 200 is provided to stably support the to-be-processed object S in the treating space R, and a mount surface on which the to-be-processed object S is mounted is formed. The stage 200 may be provided in a block shape so as to be fixed to inner bottom surface of the lower chamber, and although not shown, may also be provided to rotate the to-be-processed object S such that the entire region of the to-be-processed object S may be irradiated by the light radiated from the heat source unit 300.

The heat source unit 300 is installed such that at least a portion thereof passes through the upper chamber 110 and is disposed so as to be spaced apart over an upper portion of the stage 200. The heat source unit 300 may be installed in the upper chamber 110 such that an end portion thereof from which light is radiated is disposed inside the treating space R so that the light may be radiated toward the stage 200. The heat source unit 300 includes a first lamp 310 which radiates ultraviolet light UV to the to-be-processed object S to irradiate the object S on the stage 200 with light in two stages. Accordingly, the heat source unit 300 irradiates the to-be-processed object S in two stages and thereby may control the hydrogen concentration in the to-be-processed object S. Here, the method for controlling the hydrogen concentration by using the heat source unit 300 will be described below in detail.

The first lamp 310, which irradiates the to-be-processed object S with ultraviolet light, is used for a first light radiation of the two-stage light radiation of the heat source unit 300. The first lamp 310 functions to debond a Si—H bonding structure included in the to-be-processed object S. More specifically, the first lamp 310 radiates ultraviolet light toward the to-be-processed object S and may thereby debond the Si—H bond formed in the to-be-processed object S. This is because the ultraviolet light having a wavelength band similar to the bonding energy of Si and H is radiated, so that the energy for debonding the Si—H bond may be transferred to the to-be-processed object S.

Here, the first lamp 310 may be disposed such that the entire region of the to-be-processed object S may be irradiated with light. That is, the first lamp 310 is provided in plurality such that the light-radiating area of the first lamp 310 may cover the entire area of the to-be-processed object S and may be installed in the upper chamber 110.

The second lamp 330, which radiates light of the infrared range toward the to-be-processed object S, is used for a second light radiation of the two-stage light radiation of the heat source unit 300. The second lamp 330 irradiates the to-be-processed object S after the first lamp 310 irradiates the to-be-processed object S, and thereby functions to vaporize hydrogen (H) separated from Si—H bonds by the first lamp 310. More specifically, the second lamp 330 radiates the light of the infrared range toward the to-be-processed object S to thereby increase the temperature inside the treating space R, and may thus heat the to-be-processed object S. Accordingly, through the heating, the hydrogen (H) contained in the to-be-processed object S is allowed to be removed by being vaporized due to heat. Here, the second lamp 330 is installed in the upper chamber 110 together with the first lamp 310 and is thus required to be installed in the upper chamber 110 at a position which does not overlap the position at which the first lamp 310 is installed. That is, the second lamp 330 may be installed in the upper chamber 110 at a position at which the first lamp 310 is not installed, after the first lamp 310 is installed in the upper chamber so as to irradiate the entire area of the to-be-processed object S with light.

Referring to FIGS. 2 to 5, the installation positions of the first and second lamps 310 and 330 will be described in detail. The first lamp 310 may be disposed so as to surround the second lamp 330 with respect to the second lamp 330. Also, with respect to the entire region of the irradiated surface of the to-be-processed object S, the first and second lamps 310 and 330 are disposed such that the radiating area of the first lamp 310 is formed greater than that of the second lamp 330.

Figure 2:
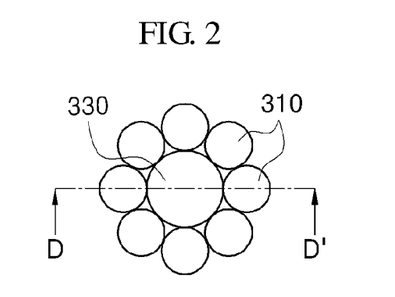
FIG. 2~5 are a view for describing a heat source unit in accordance with an exemplary embodiment.
Figure 3:
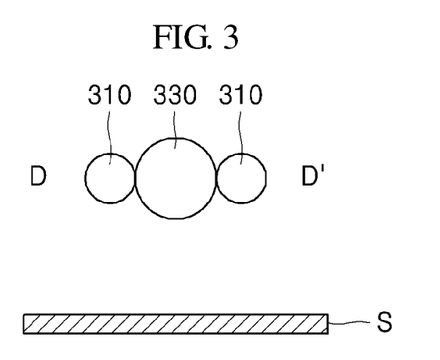

That is, as illustrated in FIG. 2, the first and second lamps 310 and 330 may be disposed such that, when viewed in the direction facing the irradiated surface of the to-be-processed object S, the second lamp is disposed on the center, and the first lamp 310 is disposed so as to surround the second lamp 330. When viewed in a cross-section, as illustrated in FIG. 3, the first lamps 310 are disposed on both sides of the second lamp 330 with the second lamp 330 disposed therebetween over the to-be-processed object S.

Figure 4:
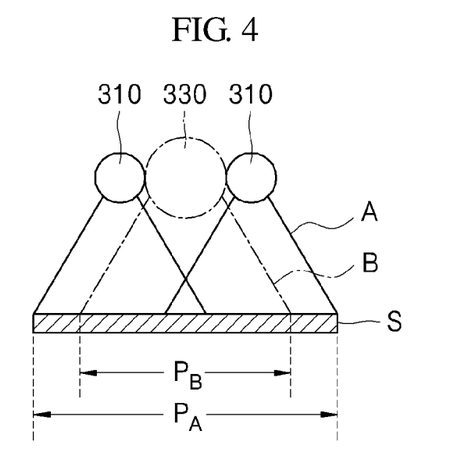

As such, the first lamps 310 are disposed so as to surround the second lamp 330, so that as illustrated in FIG. 4, the light radiated from the first lamp 310 may be radiated so as to have the width PA which is the same as the width of the to-be-processed object S with respect to the entire width of the to-be-processed object S. Accordingly, the ultraviolet light UV radiated from the first lamp 310 irradiates the entire region of the to-be-processed object S which has Si—H bonds, and may thus separate, from Si, the hydrogen which is present as shapes of Si—H bonds inside the to-be-processed object S.

Figure 5:
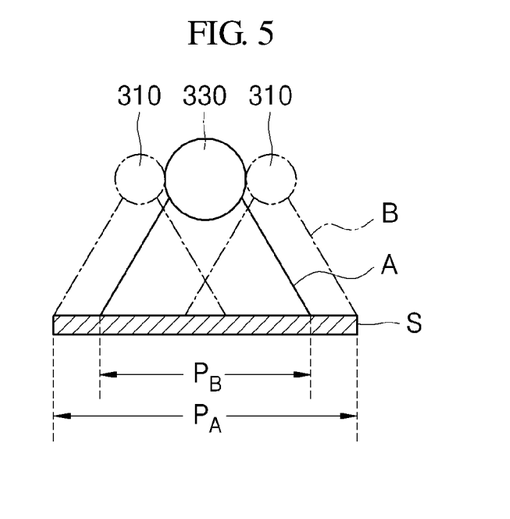

Also, the second lamp 330 is disposed between the first lamps 310 and thus irradiates, as the solid line in FIG. 5, only a predetermined width PB from both ends toward the inside of the to-be-processed object S with respect to the entire width of the to-be-processed object S. Here, since the light of the infrared range radiated from the second lamp 330 increases the temperature of the to-be-processed object S, although the light of the infrared range radiated from the second lamp 330 does not irradiates the entire region of the to-be-processed object S, heat transfer occurs from the region which is irradiated with the light toward the region which is not irradiated with the light. Accordingly, even the region which is not irradiated with the light of the second lamp 330 may be heated and the hydrogen in the entire region of the to-be-processed object S may thereby be vaporized.

While the second lamp 330 may increase the temperature of the entire region of the to-be-processed object S by the heat transfer, the second lamp 330 may be installed in such a size that may increase the irradiated area than the size of the first lamp 310 so that the light of the second lamp 330 may be radiated to a range which is close to the entire irradiated surface of the to-be-processed object S.

Conversely, although not shown, when the first lamps 310 do not surround the second lamp 330 and the second lamps 330 surrounds the first lamp 310, the irradiated area in which the light of the infrared range is radiated to the to-be-processed object S is increased, but the irradiated area in which the light of the ultraviolet range is radiated to the to-be-processed object S becomes smaller than that of the irradiated area with the light of second lamp 330. As such, when the light radiated from the first lamp 310 may not irradiate the entire area of the to-be-processed object S, only the hydrogen present in some regions which are irradiated by the light is separated from Si—H bonds. Thus, the ease of vaporizing hydrogen by the heating of the second lamp 330 is achieved only in the region irradiated by the first lamp 310, and thus the efficiency in removing hydrogen is decreased.

The control unit 400 is provided to be connected to the heat source unit 300 and to control the heat source unit 300 such that the first lamp 310 is operated and then the second lamps 330 are operated. That is, since the dehydrogenation process is sequentially performed in two stages such that a first light source is radiated through the first lamp 310, and a second light source is then radiated through the second lamp, the control unit 400 may control the operation of the heat source unit 300 when the dehydrogenation process is performed so as to allow the first and second lamps 310 and 330 to be operated.

At this time, as illustrated in FIG. 6, the control unit 400 may control the heat source unit 300 by operating the second lamp 330 at the same time when the operation of the first lamp 310 is stopped. That is, the control unit 400 operates the first lamp 310 to irradiate the to-be-processed layer for a predetermined time with the first light source A, then stops the operation of the first lamp 310 and at the same time, operates the second lamp 330 to allow the second light source B to irradiate the to-be-processed layer for a predetermined time.

Also, as illustrated in FIG. 7, the control unit 400 may control the heat source unit 300 by operating the second lamp 330 with a time difference after the operation of the first lamp 310 is stopped. That is the control unit 400 operates the first lamp 310 to irradiate the to-be-processed layer with the first light source A, and then stops the operation of the first lamp 310. Next, the first and second lamps 310 and 330 are maintained in non-operating states for a predetermined time h. Then, after the predetermined time h elapses, the second lamp 330 is operated to allow the second light source B to irradiate the to-be-processed layer. At this time, the time difference h between the time points at which the operation of the first lamp 310 is stopped and the time point at which the operation of the second lamp 330 is started may be set within approximately 1 hour to approximately 2 hours.

Also, as illustrated in FIG. 8, the control unit 400 may control the heat source unit 300 such that the radiation time of the first light source A of the first lamp 310 and the radiation time of the second light source B of the second lamp 330 overlap each other. Here, the degree of overlapping of the radiation times of the first light source A and the radiation time of the second light source B is not limited. That is, when the radiation time of the first light source A is divided into initial, intermediate and final stages and the radiation time of the second light source B is divided into initial, intermediate and final stages, the final stage time of the first light source A and the initial stage time of the second light source B may be set to overlap each other. Also, the radiation time of the first light source A and the radiation time of the second light source B may be set to overlap by 100%. However, when the final stage time of the first light source A and the initial stage time of the second light source B may be set to overlap each other, the irradiation with the second light source may be formed in a state in which a chemical reaction in the to-be-processed layer occurs sufficiently by irradiation with the first light source A.

A method for manufacturing a semiconductor device according to an exemplary embodiment using the apparatus for manufacturing a semiconductor device provided as described above, includes: forming a to-be-processed layer which contains hydrogen on a substrate; and performing a dehydrogenation by irradiating the to-be-processed layer with light in two stages.

Hereinafter, the dehydrogenation process according to an exemplary embodiment will be described, the dehydrogenation process being applied by structures of the semiconductor device. That is, a top gate type in which gate electrodes and source and drain electrodes are positioned on sides different from each other with an active layer disposed therebetween on a substrate, and a bottom gate type in which gate electrodes are disposed under source and drain electrodes will be described with an example of an oxide semiconductor device in which the active layer is formed of an oxide. Also, a planar type in which all of gate electrodes and source and drain electrodes are positioned on a surface of one side of the active layer will be described with an example of a manufacturing process for LTPS semiconductor device. However, the manufacturing process for each structure is not limited to the description below, but is to describe that the dehydrogenation process according to an exemplary embodiment is performed by a two-stage light irradiation during a process for manufacturing a semiconductor device having source and drain electrodes after the forming of the hydrogen-containing to-be-processed layer.

First, a to-be-processed object S is prepared by forming a to-be-processed layer containing hydrogen on a substrate (S100). Here, the to-be-processed object S refers to a structure in which a predetermined treatment before manufacturing a semiconductor device is completed, and more specifically, refers to a structure in which a hydrogen-containing to-be-processed layer is formed on a substrate. That is, as described above, the to-be-processed object S may refer to a structure which is a thin film formed on a substrate through a chemical vapor deposition (CVD) method by using a hydrogen-containing source during manufacturing a semiconductor device having source and drain electrodes.

The above-mentioned to-be-processed object S may be provided with any one of: a first to-be-processed object S1 in which, as illustrated in FIG. 10, the source and drain electrodes 16a and 17a are formed on an insulating substrate 11a (S10a), an active pattern 14a is formed on the source and drain electrodes 16a and 17a (S20a), and a gate insulating film 13a is formed as a to-be-processed layer on the active pattern 14a (S40a); a second to-be-processed object S2 in which, as illustrated in FIG. 11 (S10b), a gate electrode 12b is formed on an insulating substrate 11b (S10b), and a gate insulating film 13b is formed as a to-be-processed layer on the gate electrode 12b (S20b); and a third to-be-processed object S3 in which, as illustrated in FIG. 12, amorphous silicon 23 is formed as a to-be-processed layer on an insulating substrate 21.

With regard to the first to-be-processed object S1, the first to-be-processed object S1 is a structure in which, during manufacturing an oxide thin film transistor, the source and drain electrodes 16a and 17a are formed on an insulating substrate 11a, the active pattern 14a including an oxide semiconductor is formed as a to-be-processed layer on the source and drain electrodes, and a gate insulating film 13a is formed on the active pattern. That is, the first to-be-processed object S1 may be manufactured as a semiconductor by forming the gate electrode 12a after the dehydrogenation process S30 is performed.

With regard to the second to-be-processed object S2, the second to-be-processed object S2 is a structure in which, during manufacturing an oxide thin film transistor, the gate electrode 12b is formed on an insulating substrate 11b, and a gate insulating film 13b is formed on the gate electrode. That is, the second to-be-processed object S2 may be manufactured as a semiconductor by forming the active pattern 14b including an oxide semiconductor is formed (S40b) after the dehydrogenation process (S30) is performed, and the source and drain electrodes 16b and 17b are formed (S50b).

Here, due to the process characteristics when the gate insulating films 12a and 12b of the first and second to-be-processed objects S1 and S2 are formed, hydrogen ions are necessarily present inside the thin film. That is, since the gate insulating films 12a and 12b are formed through a plasma enhanced chemical vapor deposition (PECVD), hydrogen ions are necessarily present inside the thin film. Accordingly, unless a portion of hydrogen present in the gate insulating film 12a and 12b is removed to decrease the hydrogen concentration, hydrogen bursts out to the active patterns 14a and 14b, and thus the quality of the thin film deteriorates and the electrical characteristics of a semiconductor is decreased. Accordingly, with regard to the first to-be-processed object S1, the active pattern 14a is formed, the gate insulating film 12a is formed on the active pattern and the dehydrogenation process (S30) is then performed. With regard to the second to-be-processed object S2, the gate insulating film 12b is formed, and the dehydrogenation process (S30) is performed before the active pattern 14b is formed on the gate insulating film. Accordingly, the influence of hydrogen on the layer on the active patterns 14a and 14b is reduced, and thus hydrogen is fundamentally prevented from penetrating into the thin film of the layer of the active patterns 14a and 14b.

With regard to still another third to-be-processed object S3, the third to-be-processed object S3 is an intermediate structure in which amorphous silicon (a-Si) is formed (S10c) as a to-be-processed layer on the substrate 21 in the low temperature polysilicon process (LTPS TFT) manufacturing a thin film transistor (TFT) using poly-crystalline silicon. That is, with regard to the third to-be-processed object S3, after the dehydrogenation process (S30) is performed, the crystallizing the amorphous silicon layer 23 to form into the active layer 23 (S20c) is performed, and then the forming the gate insulating film 24 and the gate electrode 25 on the active layer (S40c) are performed. Then, the insulating film 26 is formed on the entire region, source and drain electrodes 27 and 28 which are connected to the active layer 23 are formed (S50C), and thus a semiconductor device may be manufactured Here, with regard to the third to-be-processed object S3, due to process characteristics when the amorphous silicon (a-Si) layer is formed on the insulating substrate 21, the amorphous silicon thin film 23 is formed while containing hydrogen ions in the thin film. Accordingly, unless a portion of hydrogen present in the thin film is removed before poly-crystallizing the thin film, hydrogen explodes during crystallizing the amorphous silicon by laser, and thereby a limitation of decreasing process stability is caused. Accordingly, with regard to the third to-be-processed object S3, the dehydrogenation process (S30) is performed before crystallizing the amorphous silicon film to form as an active layer.

As described above, when the to-be-processed object S having Si—H bonding structures is prepared (S100), the dehydrogenation is performed through the two-stage light radiation on the to-be-processed object S (S200). The dehydrogenation process includes: irradiating the prepared to-be-processed object S with the first light source by the first lamp 310 (S210); and irradiating the to-be-processed object S with the second light source by the second lamp 330.

The irradiating of the prepared to-be-processed object S with the first light source by the first lamp 310 (S210) may be performed by operating the lamp which emits ultraviolet light (UV) to irradiate the to-be-processed object S with the ultraviolet light. When irradiating the to-be-processed object S with ultraviolet light, the entire irradiated surface (that is, the upper surface of the to-be-processed object inside the chamber) on which a thin film is formed is irradiated. This is because only when the entire region of the to-be-processed object S is irradiated with the ultraviolet light which is the first light source, debonded Si—H bonds are not only a portion of Si—H bonds which are present inside the thin film of the to-be-processed object S but the Si—H bonds of the entire thin film. As such, the object S is irradiated with the ultraviolet light which is the first light source, so that as illustrated above, the ultraviolet light debonds the Si—H bonds in the thin film.

Here, in the irradiating the to-be-processed object S with the first light source through the first lamp 310, the output strength (power, %) of the first light source is the important factor rather than the time for which the first light source is radiated. That is, since the purpose of radiating the first light source is not to induce a thermal reaction of the to-be-processed object S but to induce a chemical reaction (reaction for separating Si—H bonds), it is sufficient to radiate the first light source only for the time in which nearly all the Si—H bonds present in the to-be-processed object S are debonded. Conversely, since the chemical reaction of the to-be-processed object S is also increased according to the increase in the output strength (power, %), as the output strength of the first light source is increased, the hydrogen ion concentration in the semiconductor manufactured under the same irradiation process condition of the second light source is decreased. This may be explained through FIG. 14. FIG. 14 is a graph illustrating the hydrogen ion concentration in the semiconductor according to the change in the output strength of the first lamp 310 in a state in which the radiation time of the first lamp 310 is set to 10 minutes, and the radiation of the second lamp 330 is set to 30 minutes at 400° C. Referring to results in FIG. 14, as the output strength of the first light source radiated from the first lamp 310 is increased to 40%, 60% and 100%, the hydrogen ion concentration in the thin film in the to-be-processed object S is gradually decreased.

After the Si—H bonds are debonded by the first light source, the irradiating of the to-be-processed object S with the second lamp 330 (S220) is performed such that the lamp which emits light of the infrared range is operated to increase the temperature of the to-be-processed object S. Here, the irradiating with the second light source B may be continued until the hydrogen (H) ion concentration in the to-be-processed layer reaches approximately 2 atom % to approximately 5 atom %. Accordingly, the hydrogen ions which are present in a state of being separated from Si in the thin film of the to-be-processed object S may be removed in the to-be-processed layer by being vaporized due to the heat formed by the irradiation with the second light source. Here, unlike the first light source, the second light source is not necessarily required to be radiated to the entire are of the to-be-processed object S. This is because the second light source functions to increase the temperature of the to-be-processed object S, and even if the second light source is radiated to only a predetermined region, the heat due to the second light source may be transferred to the entire region of the to-be-processed object S by heat transfer. Accordingly, the hydrogen ions present in the thin film of the to-be-processed object S may be vaporized by the heat transfer.

As such, the radiating of the second light source to vaporize hydrogen in the to-be-processed object S (S220) may be performed at a temperature lower than approximately 400° C. due to the radiating of the first light source to separate hydrogen ion from Si in the to-be-processed object S. This means that the dehydrogenation process (S200) is performed at a temperature of lower than approximately 400° C. That is, since the first light source is radiated and the hydrogen ions present in the thin film of the to-be-processed object S is thereby present in a separated state, a temperature of higher than 450° C. is required in related art to separate hydrogen ions from Si—H and vaporize the hydrogen ions by performing only a heating treatment. However, the Si—H bond is debonded by the radiating of the ultraviolet light, which is the first light source, in the dehydrogenation process according to an exemplary embodiment. Therefore, in comparison with the conventional debonding of Si—H by a heating treatment, the hydrogen concentration may be easily controlled, and the dehydrogenation process may be performed at a low temperature.

As described above, when the dehydrogenation process is completed by a two-stage light irradiation (S220), remaining layers which have not yet been formed are formed on the dehydrogenation-completed to-be-processed object S and thereby the manufacturing of the semiconductor having source and drain electrodes is completed (S300).

That is, referring to FIG. 10, the entire process for manufacturing a semiconductor device 10a will be described with respect to the first to-be-processed object Si as follows.

The source and drain electrodes 16a and 17a are formed on the insulating substrate 11a (S10a), and the active pattern 14a is formed on the source and drain electrodes 16a and 17a (S20a). Then, the gate insulating layer 13a is formed on the active pattern 14a (S40a). Then, light of ultraviolet and infrared ranges are sequentially radiated and the dehydrogenation is then performed (S30) such that Si—H chemical bonds contained in the gate insulation film 13a are debonded and hydrogen is then removed by being vaporized. Then, when the dehydrogenation is completed, the gate electrode 12a is formed on the gate insulating film 13a, and a passivation layer 18a is then formed to complete the manufacturing process.

Also, referring to FIG. 11, the entire process for manufacturing a semiconductor device 10b will be described with respect to the second to-be-processed object S2. The gate electrode 12b is formed on the insulating substrate 11b (S10b), and the gate insulating film 13b is formed on the gate electrode 12b (S20b). Then, light of ultraviolet and infrared ranges are sequentially radiated and the dehydrogenation is then performed (S30). Then, when the dehydrogenation is completed, the active pattern 14b is formed on the gate insulating film 13b (S40b), the soured and drain electrodes 16b and 17b are formed on the active pattern 14b (S50b), and a passivation layer 18b is then formed to complete the manufacturing process.

Also, referring to FIG. 12, the entire process for manufacturing a semiconductor device 20 will be described with respect to the third to-be-processed object S3. The amorphous silicon is formed by deposition on the insulating substrate 21 (S10c), light of ultraviolet and infrared ranges are sequentially radiated, and the dehydrogenation is then performed (S30). Then, when the dehydrogenation is completed, the amorphous silicon is melted at a low temperature to be crystallized and is thereby formed as an active layer 23. Then, the gate electrode 25 and the gate insulating film 24 are formed on the active layer 23 (S40c), and the source and drain electrodes 27 and 28 are formed so as to communicate with the active layer 23.

Hereinafter, the effect of the dehydrogenation process according to an exemplary embodiment through changes in process conditions of the first and second lamps 310 and 330 in the process of manufacturing a semiconductor device and through comparison with related arts will be described with reference to Table 1 and FIGS. 15 and 16 below. Here, the data in Tables 1 and 2, and FIGS. 15 and 16 may support the description of dehydrogenation effects in the method for manufacturing a semiconductor device by performing the dehydrogenation process of the second to-be-processed object S2 among the to-be-processed objects S. Accordingly, the to-be-processed object S means the second to-be-processed object S2. However, the effect to be described is not an effect applied only to the second to-be-processed object S2, but, of course, may also be applied the same to the third to-be-processed object S3.

TABLE 1

| | First lamp (UV) | Second lamp (NIR) | | |
| --- | --- | --- | --- | --- |
| | Time (min) | Time (min) | Temperature (° C.) | Reference |
| Comparative example 1 | — | 60 | 350 | First lamp output strength: 100% |
| Comparative example 2 | — | 10 | 400 | |

TABLE 1-continued

| | First lamp (UV) | Second lamp (NIR) | | |
|---|---|---|---|---|
| | Time (min) | Time (min) | Temperature (° C.) | Reference |
| Comparative example 3 | — | 30 | 400 | |
| Comparative example 4 | — | 60 | 400 | |
| Example 1 | 10 | 10 | 400 | |
| Example 2 | 10 | 30 | 400 | |

Referring to Table 1 and FIG. 15, in comparative examples 1 to 4, when the dehydrogenation of the to-be-processed object S is performed, the first light source radiation process in which the first lamp (UV) is radiated was not performed, but the process in which the second lamp (NIR) is only radiated was performed. On the contrary, in examples 1 and 2, a process of two-stage radiation in which the second light source radiation through the second lamp (NIR) has been performed after the first light source radiation through the first lamp (UV) for dehydrogenation of the to-be-processed object S was performed.

Here, referring to enlarged graph of FIG. 15, it may be understood that the hydrogen concentration (at. %) is lower in examples 1 and 2 than in comparative examples 1 to 4.

Also, the hydrogen concentration (at. %) is nearly the same in example 1 and in comparative examples 3 and 4. It may be understood that, in example 1, the Si—H bonds in the thin film of the to-be-processed object S are debonded through the radiation process of the first lamp, so that even if the radiation times of the first and second lamps 310 and 330 of example 1 are added, it takes a shorter time than the radiation time of the second lamp in comparative examples 3 and 4. That is, in example 1, when the consumed dehydrogenation time which is the sum of first lamp radiation time and the second lamp radiation time is approximately 20 minutes, the hydrogen concentration is the nearly the same as that after only the second lamp radiation times in comparative examples 3 and 4 of approximately 30 minutes and approximately 60 minutes, respectively, are consumed. Accordingly, in example 1, chemical and thermal reactions may be provided to the hydrogen ions in the thin film in the to-be-processed object S by the radiation of the first and second lamps, and thus the efficiency of dehydrogenation may be increased in comparison with the related arts.

Also, it may be understood through the result of example 2 that the above-mentioned effects are made clearer. Example 2 shows the hydrogen concentration (at. %) in the thin film of the to-be-processed object after the second lamp radiation time is increased than in example 2 to approximately 30 minutes. Here, the reason that the hydrogen concentration is decreased in example 1 than in example 2 is because the time for vaporizing hydrogen is increased due to the increase in the second lamp radiation time and thereby hydrogen of an amount increased than in example 1 is vaporized. Also, the dehydrogenation time which is the sum of the first and second lamps of example 2 is approximately 40 minutes is smaller than that in comparative example 4. However, a chemical reaction is provided to hydrogen due to the first lamp radiation, and thus it may be understood that the dehydrogenation efficiency is increased than in comparative example 4.

In the above, through Table 1 and FIG. 15, the effect in that the consumed time for dehydrogenation process may be decreased by the chemical reaction in the thin film of the to-be-processed object S due to the irradiation of the to-be-processed object S with the ultraviolet light of the first lamp 310 may be understood through the comparison of comparative examples 1 to 4 and examples 1 and 2.

Here, through Table 2 and FIG. 16 below, according to whether to radiate the ultraviolet light which is the first light source through the first lamp 310, the change in hydrogen concentration at the same treatment temperature of the second light source will be described.

TABLE 2

| | First light source radiation (o/x) | Second light source treatment temperature (° C.) | Hydrogen concentration (at. %) | | Reference |
|---|---|---|---|---|---|
| | | | Before treatment | After treatment | |
| Comparative example 2-4 | x | 400 | 4.55 | 1.45 | First lamp output strength: 100% |
| Comparative example 5 | x | 380 | 4.17 | 1.83 | |
| Example 1-2 | o | 400 | 4.96 | 1.04 | |
| Example 4 | o | 380 | 4.54 | 1.46 | |

That is, examples 2 to 4 show the change in hydrogen concentration in the state in which the to-be-processed object S is not irradiated with the first light source, and the treatment temperature of the second light source is approximately 400° C. Also, examples 5 shows the change in hydrogen concentration in the state in which the to-be-processed object S is not irradiated with the first light source, and the treatment temperature of the second light source is approximately 380° C.

Here, referring to comparative example 5 and example 4, the first light source using the first lamp 310 in example 4 in comparison with comparative example 5, and due to the radiation of the first light source, the Si—H in the thin film of the to-be-processed object S may be debonded by a chemical reaction. Accordingly, the hydrogen concentration of example 4 is nearly the same as that before the dehydrogenation treatment in comparative example, but the process may be performed at the temperature lower than that in comparative examples 2 to 4 by approximately 20° C. Through this comparison, it may be understood there is an effect in that the treatment temperature of the second light source for vaporizing hydrogen through the first light source may be decreased by approximately 20° C.

As described above, according to an apparatus for manufacturing semiconductor device and a method for manufacturing semiconductor device using the same according to an exemplary embodiment, a thin film of a to-be-processed object is irradiated firstly with ultraviolet light and a chemical reaction for separating Si—H bonds in the thin film is thereby performed, and is irradiated secondly with light of the infrared range and a thermal reaction for vaporizing the separated hydrogen is thereby performed.

Accordingly, the hydrogen present in the thin film of the to-be-processed object is easily removed, and thus the limitation that hydrogen present in the thin film of the to-be-processed object deteriorates the electrical characteristics of a semiconductor device.

Also, since the Si—H bonds are debonded in the first ultraviolet light radiation process, H may be easily removed in the second infrared light radiation process, and thus hydrogen may be removed at a lower temperature than that in the related arts in which hydrogen is removed by only a thermal treatment for removing hydrogen by vaporizing the hydrogen. Thus, the deformation due to a high temperature in a flexible substrate (plastic substrate) which is relatively weaker than a substrate such as glass may be prevented.

Although the apparatus for manufacturing a semiconductor device and the method for manufacturing the semiconductor device using the same have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A method for manufacturing a semiconductor device having source and drain electrodes, the method comprising:
    forming a to-be-processed layer containing hydrogen on a substrate; and
    performing a dehydrogenation process by irradiating the to-be-processed layer with light in two stages, wherein the dehydrogenation process comprises:
        irradiating an entire region on the to-be-processed layer with ultraviolet light; and
        irradiating a portion on the to-be-processed layer with infrared light, after the irradiating of the to-be-processed layer with ultraviolet light.

2. The method of claim 1, wherein
    irradiating the to-be-processed layer with ultraviolet light debonds a chemical bond of Si—H in the to-be-processed layer; and
    irradiating the to-be-processed layer with infrared light vaporizes the separated hydrogen after irradiating the to-be-processed layer with ultraviolet light.

3. The method of claim 2, wherein the dehydrogenation process is performed after forming a gate electrode on the substrate and then forming an insulating film on the gate electrode by the to-be-processed layer.

4. The method of claim 2, wherein the dehydrogenation process is performed after amorphous silicon is formed on the substrate by using the to-be-processed layer.

5. The method of claim 2, wherein irradiating the to-be-processed layer with ultraviolet light and irradiating the to-be-processed layer with infrared light is performed in the same space.

6. The method of claim 2, wherein irradiating the to-be-processed layer with ultraviolet light and irradiating the to-be-processed layer with infrared light is performed in different spaces.

7. The method of claim 1, wherein performing the irradiating the to-be-processed layer with infrared light is at a temperature of approximately 350° C. to approximately 400° C.

8. The method of claim 2, wherein the dehydrogenation process is performed after forming source and drain electrodes on the substrate and forming an active pattern on the source and drain electrodes, and forming a gate insulating film on the active pattern by using the to-be-processed layer.

9. The method of claim 7, wherein the dehydrogenation process is performed after forming a gate electrode on the substrate and forming a gate insulating film on the gate electrode by the to-be-processed layer.

10. The method of claim 7, wherein the dehydrogenation process is performed after forming source and drain electrodes on the substrate and forming an active pattern on the source and drain electrodes, and forming a gate insulating film on the active pattern by the to-be-processed layer.

11. The method of claim 7, wherein the dehydrogenation process is performed after amorphous silicon is formed on the substrate by the to-be-processed layer.

* * * * *